US008686560B2

(12) United States Patent  
Parvarandeh et al.

(10) Patent No.: US 8,686,560 B2
(45) Date of Patent: Apr. 1, 2014

(54) WAFER-LEVEL CHIP-SCALE PACKAGE DEVICE HAVING BUMP ASSEMBLIES CONFIGURED TO MITIGATE FAILURES DUE TO STRESS

(75) Inventors: Pirooz Parvarandeh, Los Altos Hills, CA (US); Reynante Alvarado, San Jose, CA (US); Chiung C. Lo, Campbell, CA (US); Arkadii V. Samoilov, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 424 days.

(21) Appl. No.: 12/755,929

(22) Filed: Apr. 7, 2010

(65) Prior Publication Data
US 2011/0248398 A1  Oct. 13, 2011

(51) Int. Cl.
*H01L 23/488* (2006.01)
(52) U.S. Cl.
USPC ..... 257/737; 257/738; 257/780; 257/E23.069
(58) Field of Classification Search
USPC .................................. 257/737, 738
See application file for complete search history.

(56) References Cited

U.S. PATENT DOCUMENTS

| 5,613,861 | A | 3/1997 | Smith et al. |
|---|---|---|---|
| 6,221,750 | B1 | 4/2001 | Fjelstad |
| 6,224,396 | B1 | 5/2001 | Chan et al. |
| 6,528,349 | B1 | 3/2003 | Patel |
| 6,543,087 | B2 | 4/2003 | Yeh et al. |
| 6,560,861 | B2 | 5/2003 | Fork |
| 6,690,081 | B2 | 2/2004 | Bakir |
| 6,778,406 | B2 | 8/2004 | Eldridge |
| 6,858,941 | B2 * | 2/2005 | Ference et al. ............ 257/781 |
| 6,888,256 | B2 | 5/2005 | Hedler |
| 6,900,110 | B1 | 5/2005 | Takiar |
| 6,948,940 | B2 | 9/2005 | Lindsey |
| 7,048,548 | B2 | 5/2006 | Mathieu |
| 7,141,885 | B2 | 11/2006 | Kim |
| 7,244,125 | B2 | 7/2007 | Brown |
| 7,316,572 | B2 | 1/2008 | Bernier |
| 7,564,130 | B1 * | 7/2009 | Li ............................ 257/734 |
| 2002/0170290 | A1 | 11/2002 | Bright |

OTHER PUBLICATIONS

Kacker, Karan, Lo et al.; Low-D Dielectric Compatible Wafer-Level Compliant Chip-to-Substrate Interconnects; IEEE Transactions on Advanced Packaging; Feb. 1, 2008; pp. 22-32; vol. 31, No. 1.
Gao, Guilian et al.; Compliant Wafer Level Package for Enhanced Reliability; IEEE; 2007; pp. 1-5.

(Continued)

*Primary Examiner* — Ha Tran T Nguyen
*Assistant Examiner* — Raj R Gupta
(74) *Attorney, Agent, or Firm* — Advent, LLP

(57) ABSTRACT

Wafer-level chip-scale package semiconductor devices are described that have bump assemblies configured to mitigate solder bump failures due to stresses, particularly stresses caused by CTE mismatch during thermal cycling tests, dynamic deformation during drop tests or cyclic bending tests, and so on. In an implementation, the wafer-level chip-scale package devices include an integrated circuit chip having two or more arrays of bump assemblies for mounting the device to a printed circuit board. At least one of the arrays includes bump assemblies that are configured to withstand higher levels of stress than the bump assemblies of the remaining arrays.

9 Claims, 9 Drawing Sheets

(56) References Cited

OTHER PUBLICATIONS

Dang, Bing; Sea-of-Leads MEMS I/O Interconnects for Low-k IC Packaging; Journal of Microelectromechanical Systems; Jun. 2006; pp. 523-530; vol. 15, No. 3.

Dudek, Rainer, et al.; Thermo-mechanical Design for Reliability of WLPs With Compliant Interconnects; Electronics Packaging Technology Conference; 2005; pp. 1-7.

Bulcke, M. Vanden, et al.; Introducing a Silicone Under the Bump Configuration for Stress Relief in a Wafer Level Package; Electronics Packaging Technology Conference; 2003; pp. 380-384.

Bakir, Muhannad S., et al.; Sea of Leads (SoL) Ultrahigh Density Wafer-Level Chip Input/Output Interconnections for Gigascale Integration (GSI); IEEE Transactions on Electron Devices; Oct. 2003; p. 2039-2048; vol. 50, No. 10.

Keser, Beth, et al.; Encapsulated Double-Bump WL-CSP: Design and Reliability; Electronic Components and Technology Conference; 2001; pp. 1-5.

Syms, Richard R. A.; Surface Tension Powered Self-Assembly of 3-D Micro-Optomechanical Structures; Journal of Microelectromechanical Systems; Dec. 1999; pp. 448-455; vol. 8, No. 4.

Harsh, Kevin F., et al.; Solder Self-Alignment for Optical MEMS; IEEE; 1999; pp. 860-861.

* cited by examiner

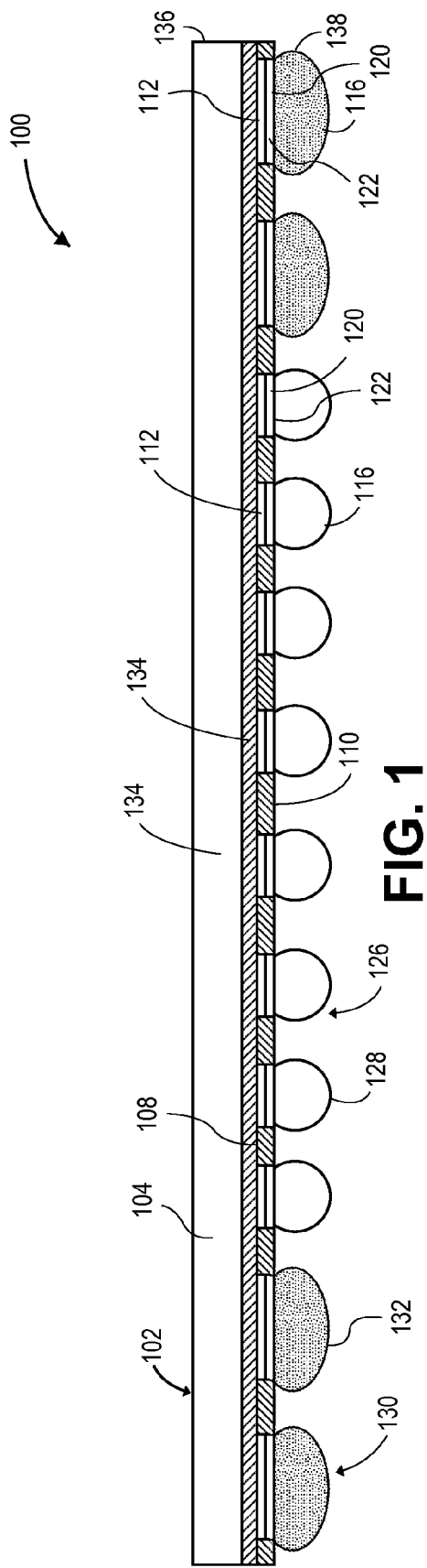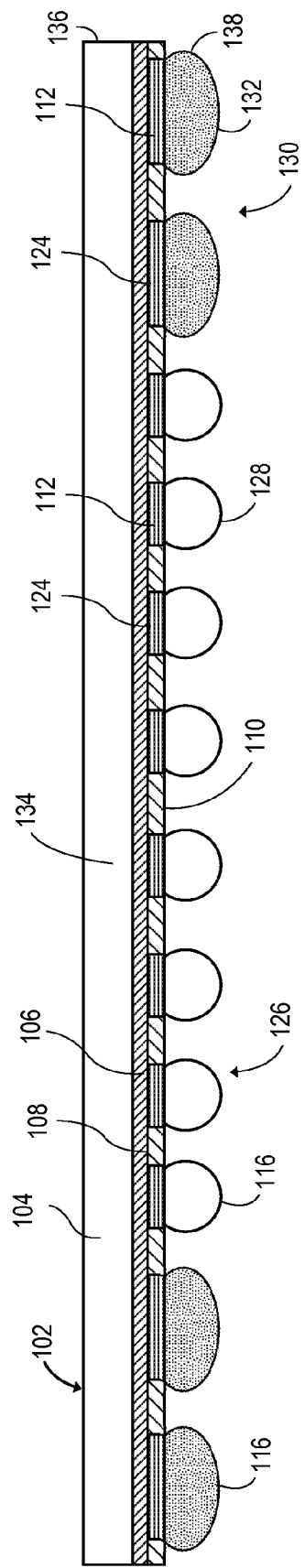

WAFER-LEVEL CHIP-SCALE PACKAGE DEVICE HAVING BUMP ASSEMBLIES CONFIGURED TO MITIGATE FAILURES DUE TO STRESS

BACKGROUND

Traditional fabrication processes used in the manufacture of semiconductor devices employ microlithography to pattern integrated circuits onto a circular wafer formed of a semiconductor such as silicon or the like. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging is an emerging chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

SUMMARY

Wafer-level chip-scale package semiconductor devices are described that have bump assemblies configured to mitigate solder bump failures due to stress in the bumps, particularly stress caused by CTE mismatch during thermal cycling tests, dynamic deformation during drop tests or cyclic bending tests, and so on. In an implementation, the wafer-level chip-scale package devices include an integrated circuit chip having two or more arrays of bump assemblies for mounting the device to a printed circuit board. At least one of the arrays includes bump assemblies that are configured to withstand higher levels of stress than the bump assemblies of the other arrays.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1 is a diagrammatic partial cross-sectional side elevation view illustrating a wafer-level chip-scale package device in accordance with an example implementation of the present disclosure.

FIG. 2 is a diagrammatic partial cross-sectional side elevation view illustrating a wafer-level chip-scale package device employing a copper (Cu) pillar bump interface in accordance with another example implementation of the present disclosure.

DETAILED DESCRIPTION

Overview

Wafer-level packaging facilitates the production of semiconductor devices that are lower in cost, have smaller form factors, and provide lower parasitic effects than devices manufactured utilizing many other packaging technologies. However, the application of wafer-level packaging techniques has heretofore been limited to use in the production of devices using small integrated circuit chips (e.g., devices with dies having a surface area of less than about 25 mm$^2$). For devices employing larger chips, the mismatch of the coefficient of thermal expansion (CTE) between the chip and the printed circuit board (FR4) to which the device is mounted becomes significant. During thermal cycling tests, this mismatch can cause high stress and cracks in solder bumps used to mount the device to the printed circuit board. In addition, during drop tests and cyclic bending tests, the relatively high stiffness of solder may cause stress to occur at the interface between the solder bumps and the inter-metallic compounds of the bumps due to dynamic deformation.

Accordingly, techniques are described for fabricating wafer-level chip-scale package semiconductor devices having bump assemblies configured to mitigate solder bump failures due to stress in the bumps, particularly stresses caused by CTE mismatch, dynamic deformation during drop tests or cyclic bending tests, and so on. The techniques thus facilitate the fabrication of wafer-level chip-scale package devices that employ large integrated circuit chips (e.g., devices that employ dies having a surface area of greater than about 25 mm$^2$). Such wafer-level chip-scale package devices may be employed in a variety of applications including, but not limited to: system on chip (SOC) applications, dynamic random access memory (DRAM) applications, and central processing unit (CPU) applications.

In an implementation, the wafer-level chip-scale package devices include an integrated circuit chip having at least one array of first bump assemblies and at least one array of second bump assemblies, formed on the integrated circuit chip, to mount the device to a printed circuit board. The second bump assemblies are configured to withstand higher levels of stress than the first bump assemblies. For example, the solder bumps of second bump assemblies may be made larger than the solder bumps of the first bump assemblies, while maintaining coplanarity. Thus, the solder bumps of the second bump assemblies may have larger surface areas than the solder bumps of the first bump assemblies, so that the amount of stress in the bumps of the first bump assemblies is reduced (for the application of a given amount of force). The solder bumps of the second bump assemblies may also have different solder compositions and/or different bump interface configurations than the solder bumps of the first bump assemblies. Thus, the solder bumps of the first bump assemblies may be more resilient to resist cracking.

Example Implementations

Figure 4:
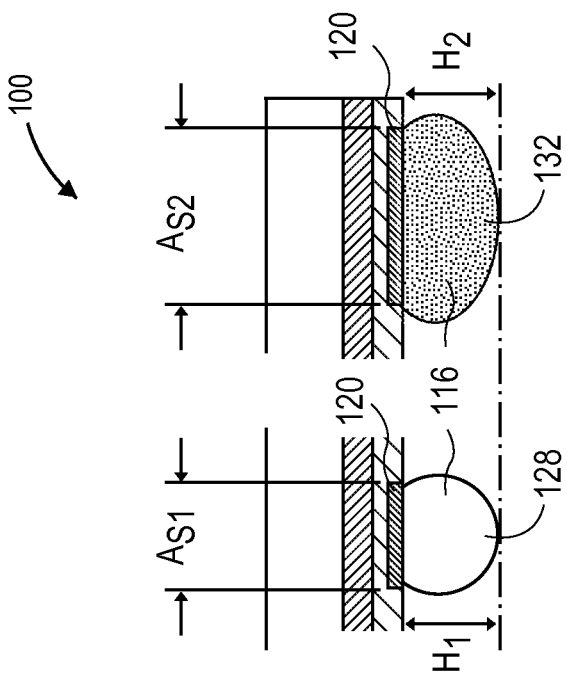
FIG. 4 is a diagrammatic partial cross-sectional side elevation view illustrating a wafer-level chip-scale package device illustrating the standoff (bump) height of the bump assemblies.
Figure 5:
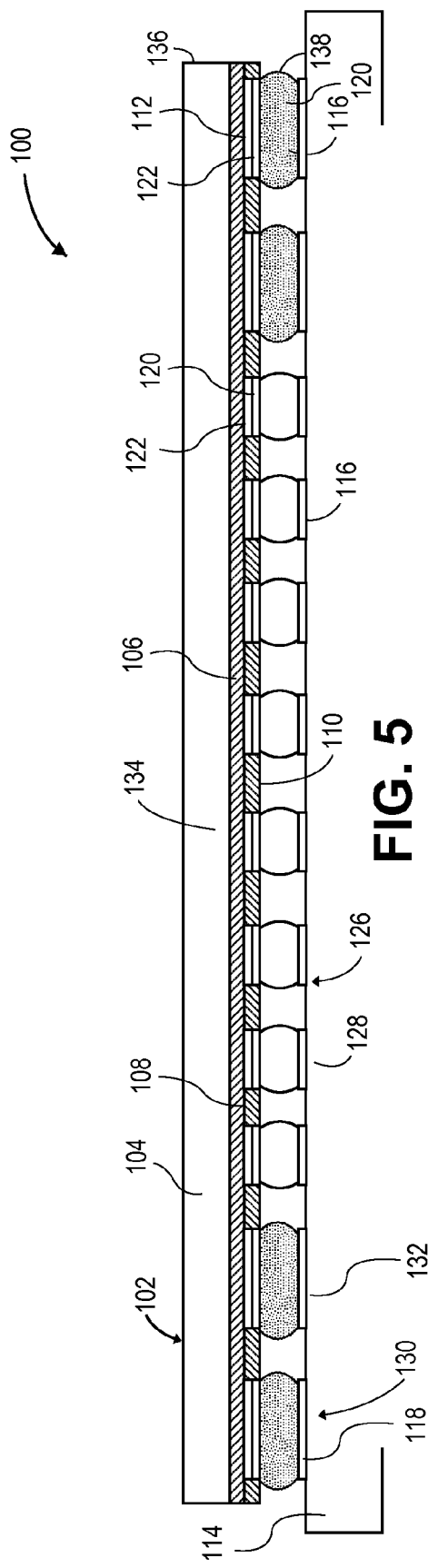
FIGS. 5 and 6 are diagrammatic partial cross-sectional elevation views illustrating the wafer-level chip-scale package devices of FIGS. 1 and 2, respectively, mounted to the printed circuit board of an electronic device.
Figure 6:
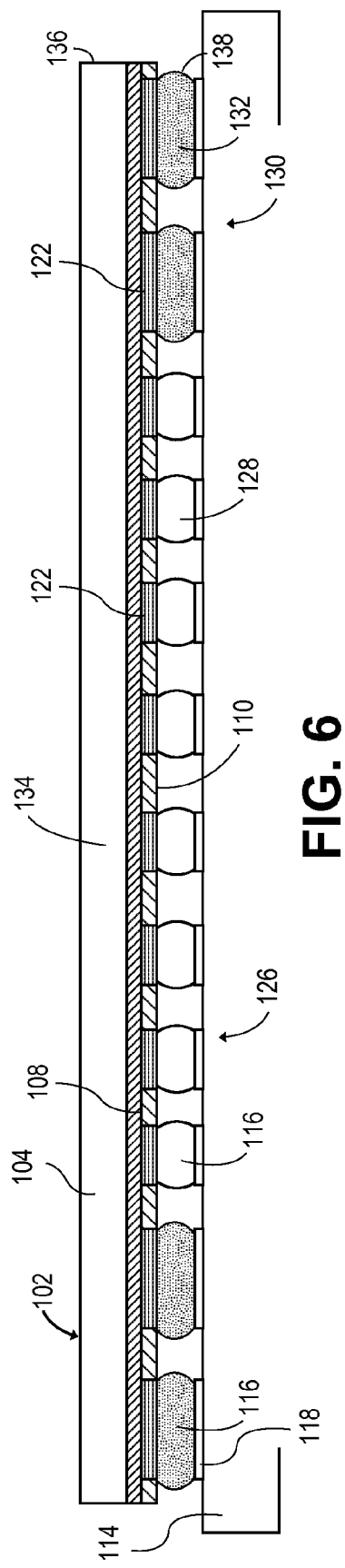

FIGS. 1 through 6 illustrate wafer-level chip-scale package devices 100 in accordance with example implementations of the present disclosure. As shown, the devices 100 include an integrated circuit chip 102 comprised of a substrate 104 and one or more integrated circuits 106 formed in a surface 108 of the substrate 104. A redistribution structure 110 is formed on the surface 108 over the integrated circuits 106. The redistribution structure 110 redistributes peripheral bonding pads of the integrated circuits 106 to one or more area arrays of bonding pads 112 that are deployed over the surface of the integrated circuit chip 102. The configuration of the redistribution structure 110 and/or the number and configuration of bonding pads 112 provided by the redistribution structure 110 may vary depending on the complexity and configuration of the integrated circuits 106, the size and shape of the integrated circuit chip 102, and so forth. The bonding pads 112 provide electrical contacts through which the integrated circuits 106 are interconnected to external components such as printed circuit boards. FIGS. 5 and 6 illustrate the wafer-level chip-scale package devices 100 of FIGS. 1 and 2, respectively, mounted to the printed circuit board 114 of an electronic device.

Solder bumps 116 are provided to furnish mechanical and/or electrical interconnection between the bonding pads 112 and corresponding pads 118 formed on the surface of the printed circuit board 114. In one or more implementations, the solder bumps 116 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) allow solder, and so on. However, it is contemplated that Tin-Lead (PbSn) solders may be used. Example processes for forming the solder bumps 116 using wafer-level packaging techniques are described in more detail below.

Bump interfaces 120 may be applied to the bonding pads 112 of the integrated circuit chip 102 to provide a reliable interconnect boundary between the bonding pads 112 and the solder bumps 116. For instance, in the wafer-level chip-scale package device 100 shown in FIG. 1, the bump interface 120 comprises under-bump metallization (UBM) 120 applied to the bonding pads 112 of the integrated circuit chip 102. The UBM 122 may have a variety of compositions. For example, the UBM 122 includes multiple layers of different metals (e.g., Aluminum (Al), Nickel (Ni), Copper (Cu), etc.) that function as an adhesion layer, a diffusion barrier layer, a solderable layer, an oxidation barrier layer, and so forth. However, other UBM structures are possible. In FIG. 2, the wafer-level chip-scale package device 100 illustrated employs a copper (Cu) pillar solder bump (CPB) structure. Thus, the bump interfaces 120 are comprised of copper (Cu) pillars 124 formed on bonding pads 112 in place of the UBM 122. An adhesion/barrier/seed layer may be applied to the bonding pads 112 under the copper pillars 124 to improve the reliability of the interconnect interface.

In accordance with the present disclosure, the wafer-level chip-scale package devices 100 include one or more arrays 126 of first bump assemblies 128 and one or more arrays 130 of second bump assemblies 132. The first bump assemblies 128 are comprised of solder bumps 116 and associated bonding pads 112, bump interfaces 120 (e.g., UBM 122 and/or copper pillars 124) that are configured to provide mechanical and/or electrical interconnection of the integrated circuit chip 102 to the printed circuit board 114. The first bump assemblies 128 are employed in areas of the integrated circuit chip 102 where the solder bumps 116 are unlikely to experience elevated levels of stress due to CTE mismatch, dynamic deformation, fatigue, and so on, and thus are unlikely to suffer stress related failure. For example, in the wafer-level chip-scale package devices 100 shown in FIGS. 1, 2, and 3, first bump assemblies 128 are arranged in one or more arrays 126 generally proximate to the center 134 of the integrated circuit chip 102. However, a variety of other arrangements are possible depending on the configuration of the integrated circuit chip 102.

The second bump assemblies 132 are comprised of solder bumps 116 and associated bonding pads 112, bump interfaces 120 (e.g., UBM 122 and/or copper pillars 124) that are configured to withstand stresses caused by CTE mismatch, dynamic deformation, fatigue, and so on, with a lower failure rate than the first bump assemblies 128. Thus, the second bump assemblies 132 are employed in place of first bump assemblies 128 in areas of the integrated circuit chip 102 where the solder bumps 116 could experience elevated levels of stress that could cause failure of the solder bumps 116. In one or more embodiments, at least some of the second bump assemblies 132 may be configured to furnish only mechanical attachment of the wafer-level chip-scale package device 100 to the printed circuit board 114. Consequently, the second bump assemblies 132 may not be electrically interconnected with the integrated circuits 106 by the redistribution structure 110. However, it is contemplated that one or more of the second bump assemblies 132 may furnish electrical connection between the device 100 and the printed circuit board 114, such as to provide power or ground to the integrated circuit 106, and so on. In such embodiments, the second bump assemblies 132 may be interconnected with the integrated circuit 106 either directly or via the redistribution structure 110.

The positions and arrangement of the second bump assemblies 132 may vary due to factors such as the size and shape of the integrated circuit chip 102, the design of the integrated circuit 106 formed on the chip 102, thermal cycling and drop testing requirements, and so on. For example, in the wafer-level chip-scale package devices 100 illustrated, second bump assemblies 132 are employed in areas proximate to edges 136 of the integrated circuit chip 102 where the solder bumps 116 of the second bump assemblies 132 may experience elevated levels of stress. In particular, the wafer-level chip-scale package devices 100 shown include a plurality of second bump assemblies 132 arranged in one or more rows 138 adjacent to the edges 136 of the integrated circuit chip 102. The number of rows 138 provided may vary depending on various design requirements. For example, in FIGS. 1 and 2, two rows 138 of second bump assemblies 132 are provided, while in FIG. 3, one row 138 of second bump assemblies 132 is provided. Moreover, in the embodiments illustrated, bump assemblies 128, 132 are not positioned at the corners 140 of the integrated circuit chip 102, since solder bumps 116 located near the corners 140 of the chip could be subjected to high levels of stress. However, it is contemplated that second bump assemblies 132 that are configured to withstand stresses encountered near the corners 140 of the integrated circuit chip 102 may be provided.

Figure 3:
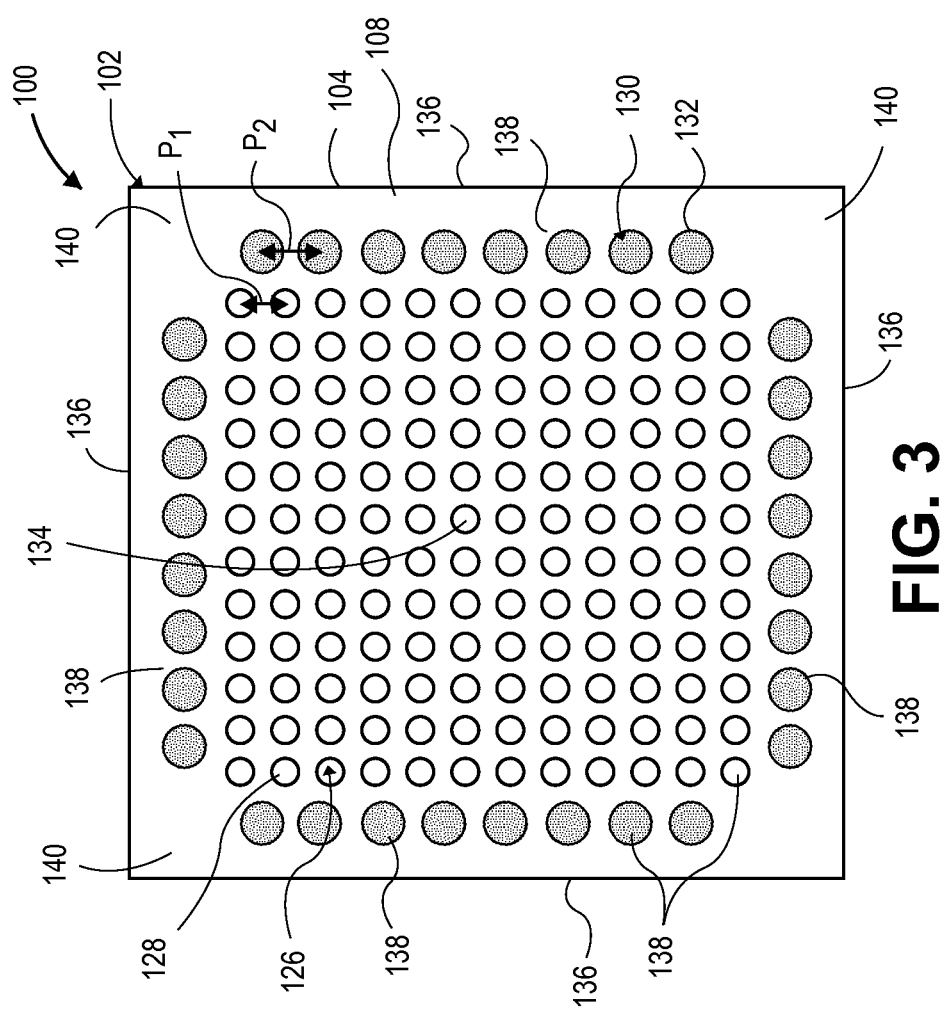
FIG. 3 is a diagrammatic top plan view of the wafer-level chip-scale package devices shown in FIGS. 1 and 2.

In the illustrated implementations, the second bump assemblies 132 are made larger than the first bump assemblies 128 so that the solder bumps 116 of the second bump assemblies 132 have a larger surface area than the solder bumps 116 of the first bump assemblies 128. For example, the bump interfaces 120 (e.g., UBM 122 or copper pillars 124) may be sized and/or shaped so that the solder bumps 116 of the first bump assemblies 128 generally have a first surface area ($A_{S1}$) and the solder bumps 116 of the second bump assemblies 132 generally have a second surface area ($A_{S2}$), wherein the second surface area ($A_{S2}$) is greater than the first surface area ($A_{S1}$). Moreover, the pitch of the solder bumps 116 in the array 130 of second bump assemblies 132 may be made greater than the pitch of the solder bumps 116 of the array 126 of first bump assemblies 128 to accommodate the increased size (surface area) of the solder bumps 116. Thus, as shown in FIG. 3, the solder bumps 116 of the first bump assemblies 128 may generally have a first pitch ($P_1$), while the solder bumps 116 of the second bump assemblies 132 may generally have a second pitch ($P_2$), wherein the second pitch ($P_2$) is greater than the first pitch ($P_1$).

Because the second bump assemblies 132 are larger than the first bump assemblies 128, forces exerted on the solder bumps 116 of the second bump assemblies 132 may be distributed over a larger area (e.g., surface area ($A_{S2}$)), reducing the amount of stress within the solder bumps 116 and decreasing the likelihood that the solder bumps 116 will suffer stress related failure. Moreover, in embodiments where the second bump assemblies 132 electrically interconnect the wafer-level chip-scale package device 100 to the printed circuit board 114, the larger surface area ($A_{S2}$) of the solder bumps 116 allows the current/voltage density within the solder bumps 116 to be lowered, reducing the susceptibility of the solder bumps 116 to electromigration. The larger surface area ($A_{S2}$) of the solder bumps 116 may also allow the second bump assemblies 132 to carry a larger amount of current compared to the first bump assemblies 128 without a corresponding increase in current/voltage density and increased electromigration. Consequently, the failure rate of the bump assemblies may be reduced so that the reliability of the wafer-level chip-scale package device 100 is increased.

In the implementations illustrated, coplanarity is maintained between the first bump assemblies 128 and the second bump assemblies 132. For example, as shown in FIG. 4, the solder bumps 116 of the second bump assemblies 132 may have a standoff (bump) height ($H_2$) that is at least approximately equal to the standoff (bump) height ($H_1$) of the solder bumps 116 of the first bump assemblies 128. Thus, the terminal ends of the solder bumps 116 (e.g., the ends of the solder bumps 116 opposite bump interfaces 120) are coplanar with one another to facilitate efficient mounting of the wafer-level chip-scale package device 100 to a printed circuit board 114 (FIGS. 5 and 6).

Coplanarity of the first bump assemblies 128 and the second bump assemblies 132 may be provided by adjusting the sizes of the respective surface areas ($A_{S1}$, $A_{S2}$) of the solder bumps 116 and the volume of solder applied to the bump interfaces 120. For example, the bump interfaces 120 (e.g., the UBM 122 and/or the copper pillars 124) of the second bump assemblies 132 are formed so that the surface areas of the bump interfaces 120 are at least substantially equal to the second surface area ($A_{S2}$), while the bump interfaces 120 of the first bump assemblies 128 are formed so that the surface areas of the bump interfaces 120 are at least substantially equal to the first surface area ($A_{S1}$). Solder applied to the bump interfaces 120 typically reflows to at least substantially wet the full surface of the bump interfaces 120, while collapsing under the influence of gravity to the lowest stress shape attainable due to surface tension of the solder. Thus, in the implementations shown, the solder bumps 116 of the second bump assemblies 132 collapse into a domed shape due to their larger surface area ($A_{S2}$), while the solder bumps 116 of the first bump assemblies 128, having a smaller surface area ($A_{S1}$), collapse into a more spherical shape. The larger surface areas ($A_{S2}$) thus allows the solder bumps 116 of the second bump assemblies 132 to contain a larger volume of solder than the solder bumps 116 of the first bump assemblies 128, while maintaining a standoff height ($H_2$) that is at least approximately equal to the standoff height ($H_1$) as the solder bumps 116 of the first bump assemblies 128.

The composition of the solder employed by the solder bumps 116 of the second bump assemblies 132 may also be selected to mitigate failures due to stress in the solder bumps 116, electromigration, and so on. For instance, the solder bumps 116 of the first bump assemblies 128 may be fabricated of solder having a first composition, while the solder bumps 116 of the second bump assemblies 132 may be fabricated of solder having a second composition that is different than the first composition. Thus, the solder bumps 116 of the second bump assemblies 132 may be fabricated of a solder having a first composition that is more resilient and thus less susceptible to the formation of cracks, than the solder employed by the solder bumps 116 of the first bump assemblies 128, which may have a second composition selected to enhance electrical conductivity. In this manner, the rate of occurrence of stress-related failures of the solder bumps 116 may be reduced, improving the reliability of the wafer-level chip-scale package device 100. Solders used in the fabrication of the solder bumps 116 may have a variety of compositions. In an example, the solder bumps 116 of the first bump assemblies 128 may be a SAC305 (Sn3.0Ag0.5Cu) alloy solder, while the solder bumps 116 of the second bump assemblies 132 may be a SAC405 (Sn3.8Ag0.8Cu) alloy solder. Other examples are possible.

The configuration of the bump interfaces 120 (UBM 122 or copper pillars 124) of the second bump assemblies 132 may also be selected to mitigate failures due to stress in the solder bumps 116, electromigration, and so on. In embodiments, the first bump assemblies 128 may employ bump interfaces 120 having a first configuration, while the second bump assemblies 132 may employ bump interfaces 120 having a second configuration that is different than the first configuration. For example, where the wafer-level chip-scale package device 100 employs a traditional solder bump structure, the UBM 122 of the second bump assemblies 132 may differ from the UBM 122 of the first bump assemblies 128 in the number and type of layers employed by the UBM 122, the thickness of various layers of the UBM 122, the materials used in the various layers of the UBM 122, and so on. Similarly, where the wafer-level chip-scale package device 100 employs a copper pillar solder bump (CPB) structure, the specific configuration of the copper pillars 124 and/or the adhesion/barrier/seed layer of the second bump assemblies 132 may differ from configuration of the copper pillars 124 of the first bump assemblies 128.

It is contemplated that in some implementations, the integrated circuit chip 102 may be provided with multiple arrays 126, 130 of first bump assemblies 128 and/or second bump assemblies 132, wherein bump assemblies 128, 132 of each array 126, 130 may comprise solder bumps 116 having different sizes (surface areas), pitches, solder compositions, and/or bump interface configurations than the bump assemblies 128, 132 of other arrays 126, 130. In this manner, the various first bump assemblies 128 and/or second bump assemblies 132 within each array 126, 130 may be configured to withstand stresses caused by CTE mismatch, dynamic deformation, fatigue, and so on, encountered by the bump assemblies 128, 132 within that array 126, 130. Moreover, it is contemplated the second bump assemblies 132 may be configured to have any combination of a larger size (surface area), a larger pitch, a different solder composition, and/or a different bump interface configuration than the first bump assemblies to mitigate failures due to stress in the solder bumps 116. Thus, in one or more implementations, integrated circuit chips 102 may be provided with second bump assemblies 132 that are least approximately the same size as the first bump assemblies 128, but which have a different solder composition and/or bump interface configuration in order to withstand elevated stresses.

Example Fabrication Processes

Figure 7:
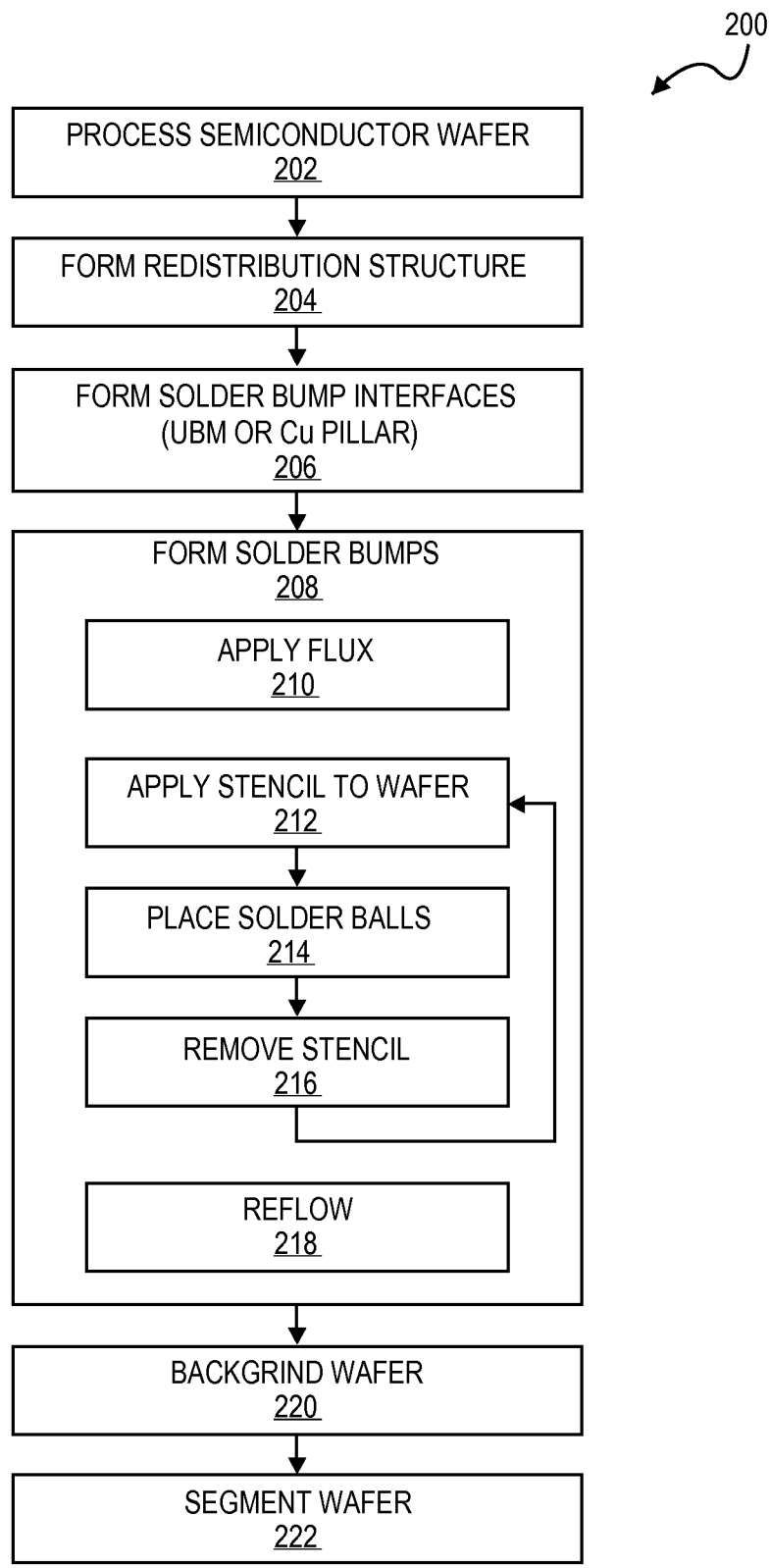
FIG. 7 is a flow diagram illustrating a process in an example implementation for fabricating wafer-level chip-scale package devices, such as the devices shown in FIGS. 1 and 2.
Figure 8A:
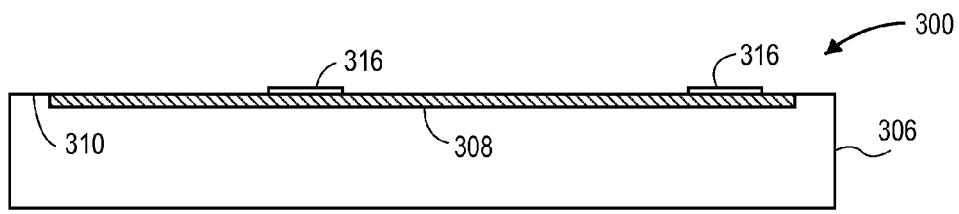
FIGS. 8A through 8H are diagrammatic partial cross-sectional side elevation views illustrating the fabrication of a wafer-level chip-scale package device, such as the device shown in FIG. 1, in accordance with the process shown in FIG. 7.
Figure 8B:
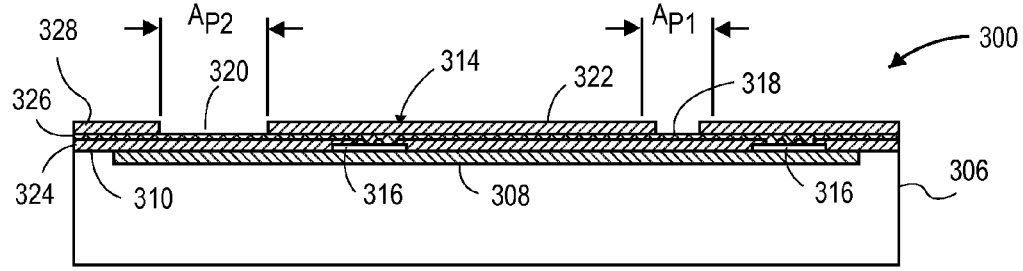
Figure 8C:
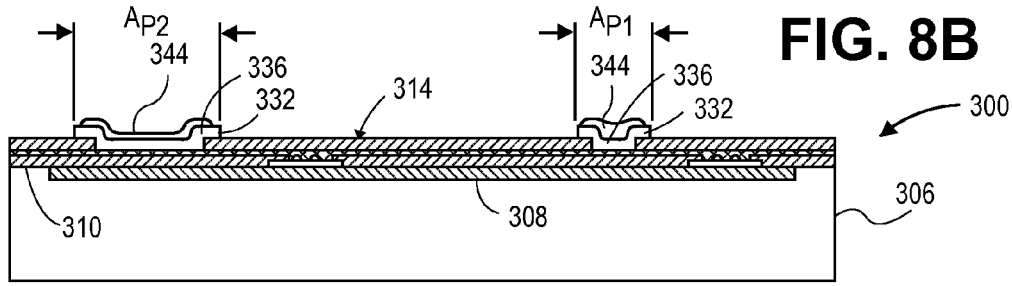
Figure 8D:
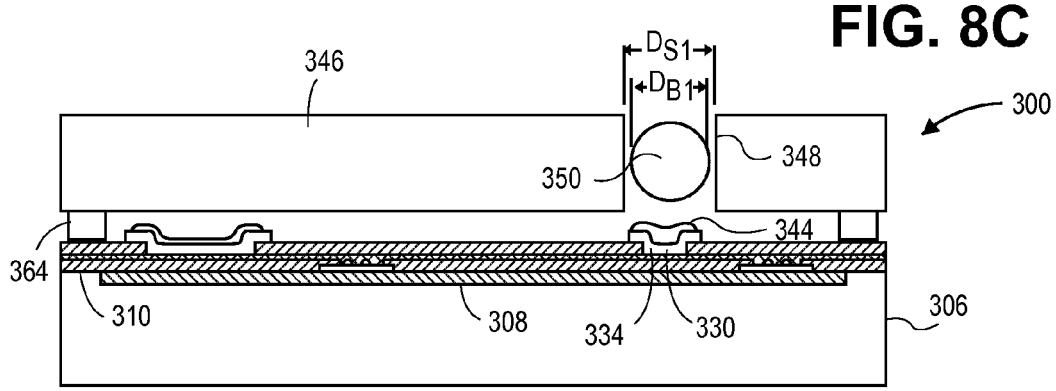
Figure 8E:
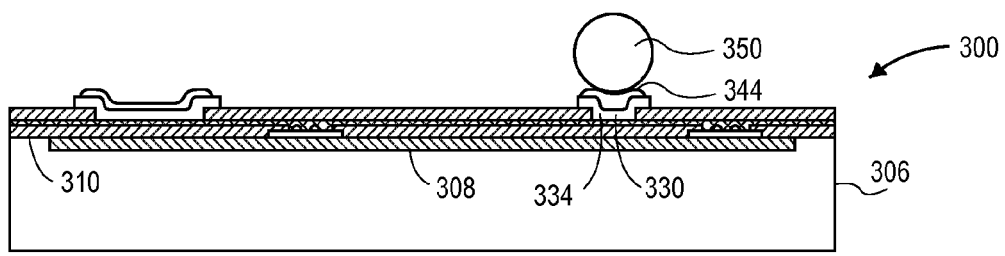
Figure 8F:
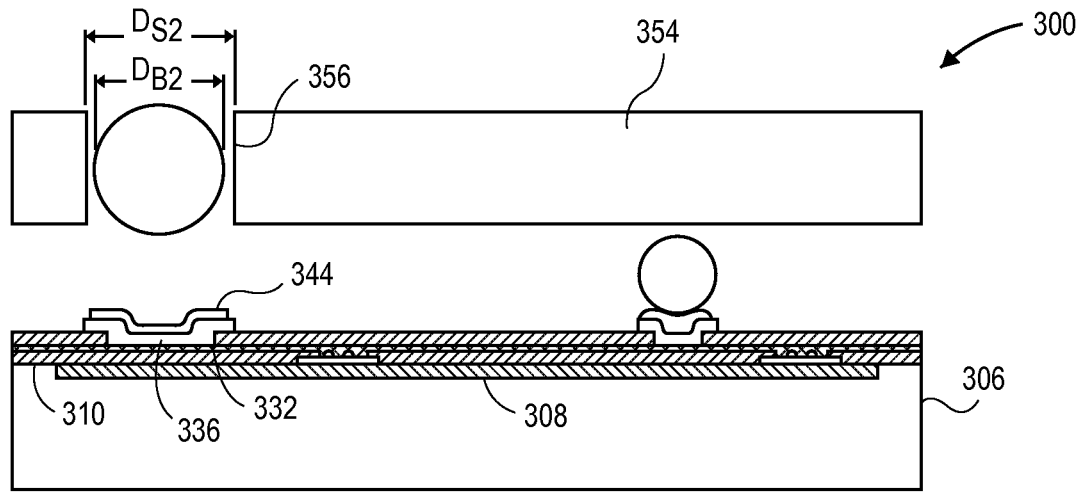
Figure 8G:
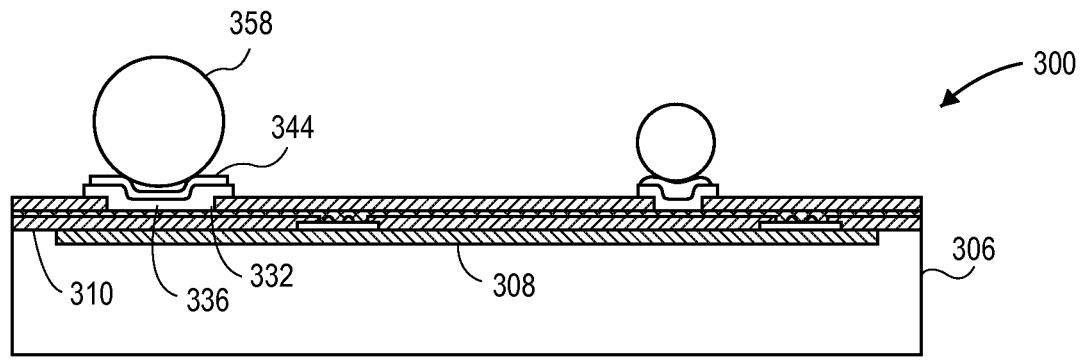
Figure 8H:
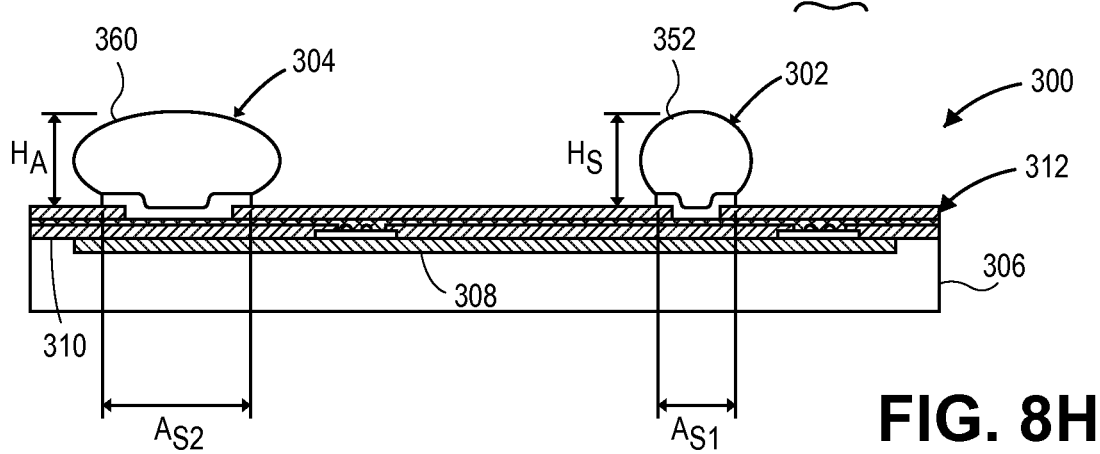
Figure 9A:
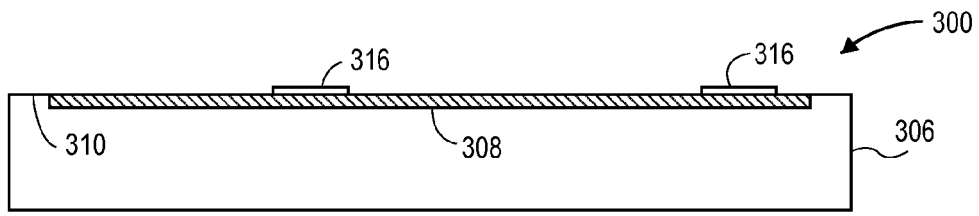
FIGS. 9A through 9H are diagrammatic partial cross-sectional side elevation views illustrating the fabrication of a wafer-level chip-scale package device having copper (Cu) pillar bump interfaces, such as the device shown in FIG. 2, in accordance with the process shown in FIG. 7.

FIG. 7 illustrates an example process 200 that employs wafer-level packaging techniques to fabricate semiconductor devices, such as the devices 100 shown in FIGS. 1 through 6. In the process 200 illustrated, first and second bump assemblies are formed on a semi-conductor wafer prior to segmentation of the wafer. As shown, the semiconductor wafer is first processed (Block 202) to create integrated circuits in the surface of the wafer using microlithography techniques. A portion of an example semiconductor wafer 300 is illustrated in FIGS. 8A through 8H and 9A through 9H illustrating the formation of an example first bump assembly 302 and an example second bump assembly 304. As shown in FIGS. 8A and 9A, the wafer 300, when processed, includes a substrate 306 having one or more integrated circuits 308 formed in a surface 310 of the substrate 306. The substrate 306 is configured to be segmented (diced) into a plurality of integrated circuit chips 312. In the implementation illustrated, the substrate 306 is fabricated of silicon. However, it is contemplated that the substrate 306 may instead be fabricated of other semiconductor materials such as germanium, gallium arsenide, silicon carbide, and so forth.

Figure 9B:
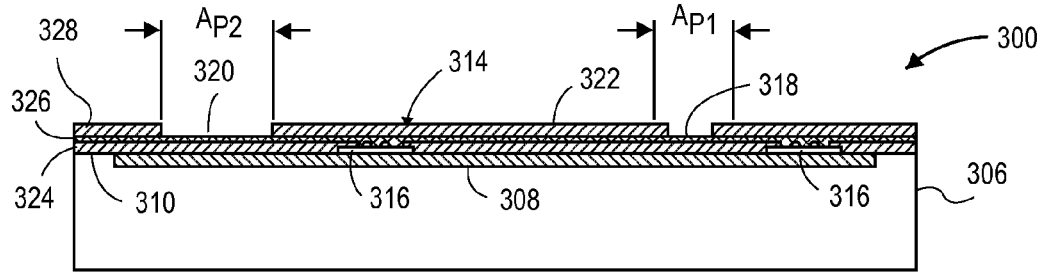

A redistribution structure is formed on the surface of the wafer 300 (Block 204) over the integrated circuits. FIGS. 8B and 9B illustrate an example redistribution structure 314. As shown, the redistribution structure 314 may have multiple layers that redistribute peripheral bonding pads 316 of the integrated circuits 308 to bonding pads 318, 320 that are deployed over the surface 322 of the wafer 300. For example, in the implementations shown, the redistribution structure 314 is illustrated as including an isolation layer 324 formed over the integrated circuits 308 to separate the integrated circuits 308 from subsequent conductive layers. The isolation layer 324 is formed of a dielectric material such as a benzocyclobutene polymer (BCB), silicon dioxide ($SiO_2$), or the like. A redistribution layer 326 formed of a conductive material such as polysilicon, a metal such as aluminum or copper, and so on, is then applied over the isolation layer 324. The redistribution layer 326 is patterned to form the bonding pads 318, 320 and to provide electrical interconnection of the peripheral bonding pads 316 of the integrated circuits 308 to the bonding pads 318, 320. As shown in FIGS. 8B and 9B, the bonding pads 318, 320 may be sized and/or shaped so that the bonding pads 318 of the first bump assemblies 302 generally have a first surface area ($A_{P1}$) and the bonding pads 320 of the second bump assemblies 304 generally have a second surface area ($A_{P2}$), wherein the second surface area ($A_{P2}$) is greater than the first surface area ($A_{P1}$). A passivation layer 328 is applied over the redistribution layer 326 and the isolation layer 324 to isolate the redistribution layer 326 and provide shape to the bonding pads 318, 320. Like the isolation layer 324, the passivation layer 328 may be formed of a dielectric material such as a benzocyclobutene polymer (BCB), silicon dioxide ($SiO_2$), or the like. It will be appreciated that the redistribution structure 314 illustrated is an example of one possible redistribution structure. Other redistribution structures are possible.

Figure 9C:
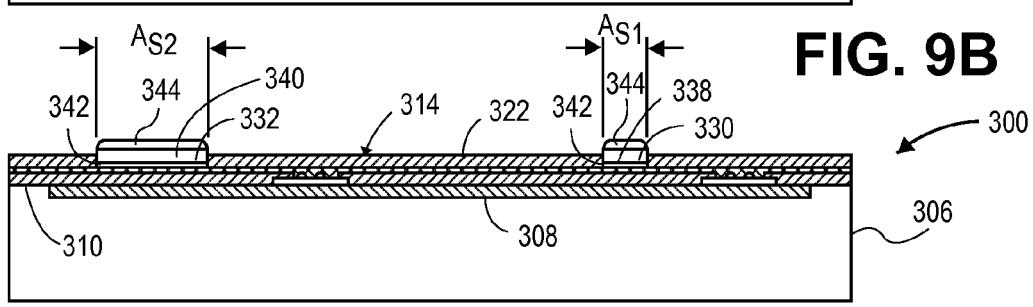

Bump interfaces are next formed on the bonding pads of the redistribution structure (Block 206). As shown in FIGS. 8C and 9C, the bump interfaces 330, 332 may be sized and/or shaped so that the bump interfaces 330 of the first bump assemblies 302 generally have a first surface area ($A_{S1}$) and the bump interfaces 332 of the second bump assemblies 304 generally have a second surface area ($A_{S2}$), wherein the second surface area ($A_{S2}$) is greater than the first surface area ($A_{S1}$) (e.g., $A_{S2} > A_{S1}$). However, in some implementations described below, it is contemplated that the first surface area ($A_{S1}$) may be at least approximately equal to the second surface area ($A_{S2}$) (e.g., $A_{S1} \approx A_{S2}$).

In the implementation shown in FIG. 8C, the bump interfaces 330, 332 comprise under bump metallization (UBM) 334, 336 applied to the bonding pads 318, 320, respectively. As noted above, the UBM 334, 336 may include multiple layers of different metals that function as an adhesion layer, a diffusion barrier layer, a solderable layer, an oxidation barrier layer, and so forth. The under bump metallization layers may be vacuum deposited by evaporation or sputtering, or may be chemically plated. In the implementation shown in FIG. 9C, the bump interfaces 330, 332 include copper (Cu) pillars 338, 340 formed on the respective bonding pads 318, 320 instead of UBM. A metal adhesion layer 342 may be applied to the bonding pads 318, 320 under the copper pillars 338, 340 to improve the reliability of the interconnect interface. In FIGS. 8C and 9C, the bump interfaces 330, 332 are illustrated as having a common configuration. However, as noted above, it is contemplated that the bump interfaces 330, 332 may differ in configuration.

Next, solder bumps are formed (Block 208) on the bump interfaces (e.g., on the UBM or copper pillars). The solder bumps may be formed in a variety of ways. In the implementations described herein, the solder bumps are formed using a ball drop process. Thus, in the following discussion, process operations characteristic of a general ball drop process are described. However, it is contemplated that the specific fabrication processes used may include other process operations without departing from the scope and spirit of the present disclosure. Moreover, it is contemplated that other techniques such as solder paste printing, evaporation, electroplating, jetting, stud bumping, and so on may be used to form the solder bumps.

As shown in FIG. 7, flux is applied (Block 210) to the bump interface (UBM or copper pillar). The flux 344 (FIGS. 8C and 9C) removes oxidation from the surface of the interface and holds the solder (e.g., a solder ball) to the bump interface prior to reflow. The flux may be applied using a variety of application techniques. For example, in one or more embodiments, the flux 344 may be applied using a screen printing process.

Figure 9D:
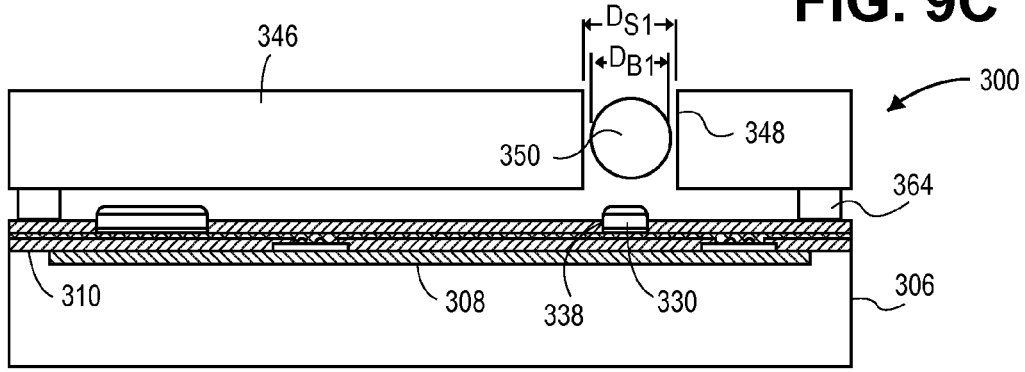
Figure 9E:
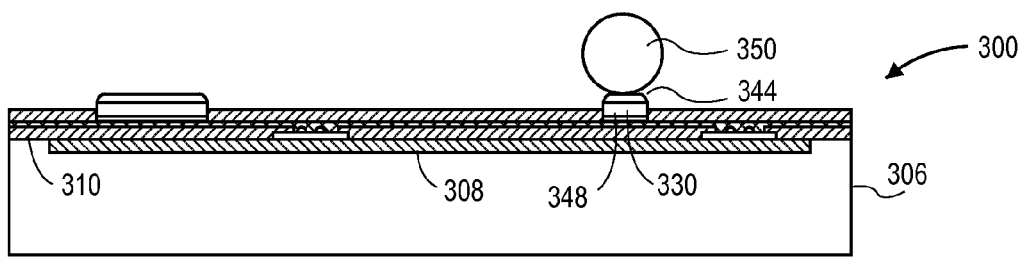
Figure 9F:
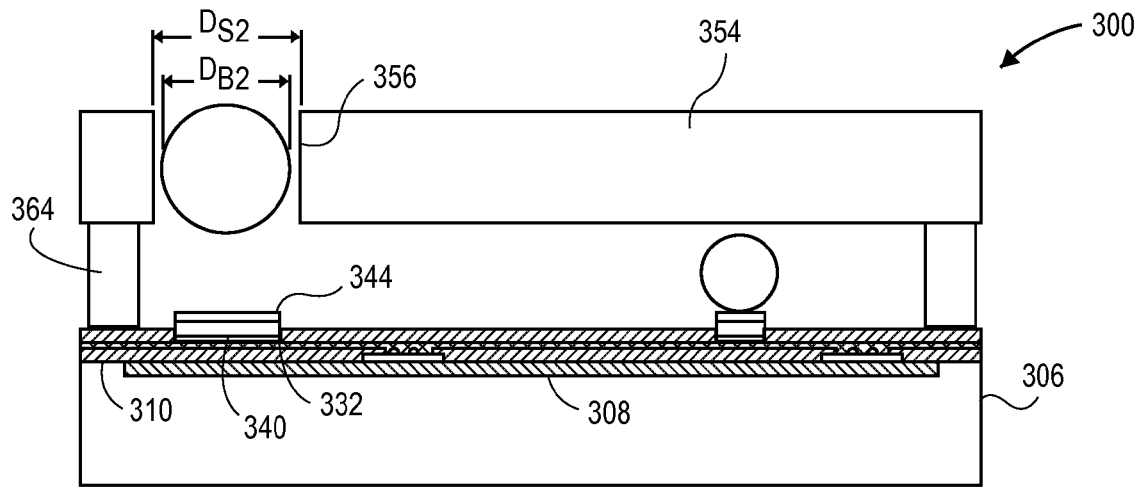
Figure 9G:
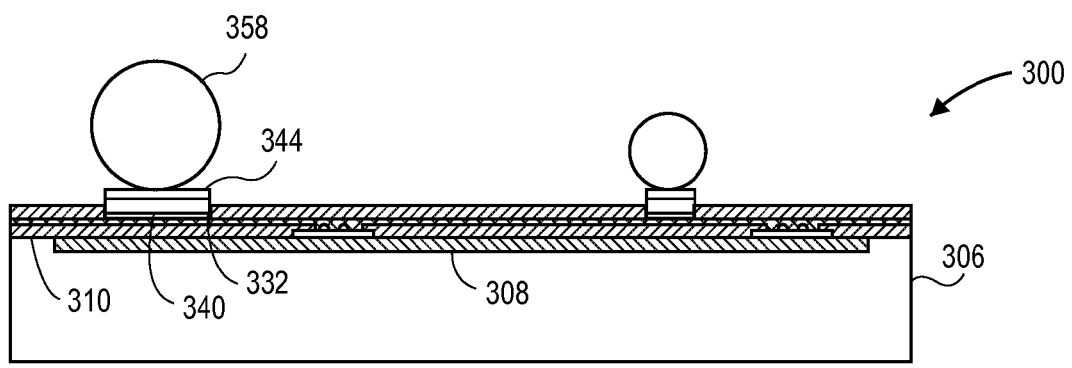
Figure 9H:
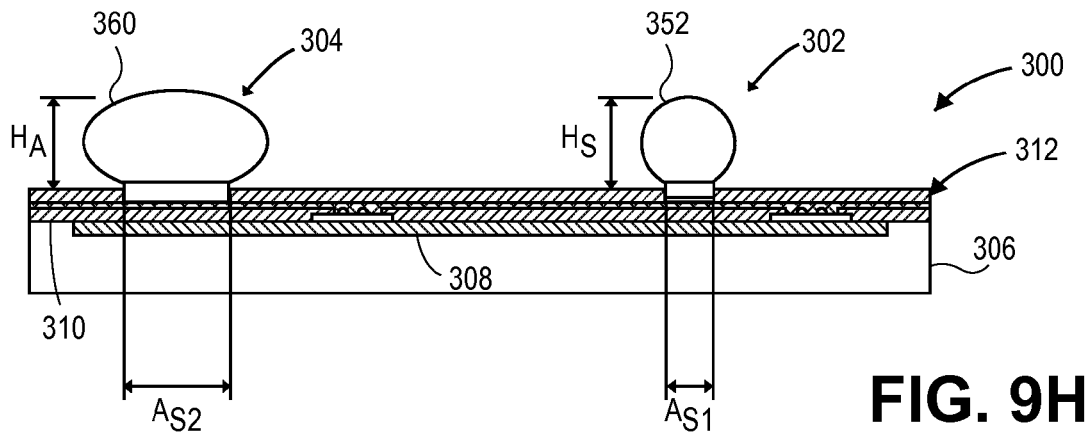

Next, a first solder ball placement stencil is applied to the wafer (Block 212) for placement of the solder balls (Block 214) that form the solder bumps of the first bump assemblies. FIGS. 8D and 9D illustrate application of the first solder ball placement stencil 346 to the surface 322 of the wafer 300. The stencil 346 includes a plurality of apertures 348 that correspond to the locations of the bump interfaces 330 (e.g., UBM 334 (FIG. 8D) or copper pillars 338 (FIG. 9D)) of the first bump assemblies 302. A single solder ball (sphere) 350 is received in each aperture 348, which places the solder ball 350 onto the respective bump interface 330 where the solder ball 350 is retained by flux 344 applied to the bump interface 330. In this manner, solder balls 350 may be placed on the bump interfaces 330 of each first bump assembly 302. The solder balls 350 are generally sized to provide an appropriate volume of solder to form the solder bumps 352 of the first bump assemblies 302 (FIGS. 8H and 9H). For example, the solder balls 350 may in general have diameters ($D_{B1}$) that yield a desired volume of solder following reflow. Accordingly, the apertures 348 of the first solder ball placement stencil 346 may have diameters ($D_{S1}$) that allow passage of a single solder ball 350 (e.g., $D_{S1} > D_{B1}$).

Following placement of the solder balls (Block 214), the stencil is removed from the wafer (Block 216). As shown in FIGS. 8E and 9E, the solder balls 350 remain affixed to the bump interfaces 330 during process operations prior to reflow by the flux 344 applied to the bump interfaces 330.

A second solder ball placement stencil is then applied to the wafer (Block 212) for placement of the solder balls (Block 214) that form the solder bumps of the second bump assemblies. FIGS. 8F and 9F illustrate application of the second solder ball placement stencil 354 to the surface 322 of the wafer 300. The second solder ball placement stencil 354 includes a plurality of apertures 356 that correspond to the locations of the bump interfaces 332 (e.g., UBM 336 (FIG. 8F) or copper pillars 340 (FIG. 9F)) of the second bump assemblies 304. Again, a single solder ball (sphere) 358 is received in each aperture 356, which channels the solder ball 358 onto the respective bump interface 332 where the solder ball 358 is retained by flux 344 applied to the bump interface 332. Thus, solder balls 358 may be applied to the bump interfaces 332 of each second bump assembly 304. The solder balls 358 are generally sized to provide an appropriate volume of solder to form the solder bumps 360 of the second bump assemblies 304 (FIGS. 8H and 9H). For example, the solder balls 358 may in general have diameters ($D_{B2}$) that yield a desired volume of solder following reflow. Accordingly, the apertures 356 of the second solder ball placement stencil 354 may have diameters ($D_{S2}$) that allow passage of a single solder ball 358 (e.g., $D_{S2} > D_{B2}$).

The second stencil is then removed from the wafer (Block 216). As shown in FIG. 8E, the solder balls 358 remain affixed to the bump interface 332 by the flux 344 applied to the bump interfaces 332 prior to reflow.

The solder balls 358 forming the solder bumps 360 of the second bump assemblies 304 have diameters ($D_{B2}$) that are larger than the diameters ($D_{B1}$) of the solder balls 350 forming the solder bumps 352 of the first bump assemblies 302 (e.g., $D_{B2} > D_{B1}$). Thus, the apertures 356 of the second solder ball placement stencil 354 may have diameters ($D_{S2}$) that are larger than the diameter ($D_{S1}$) of the apertures 348 of the first solder ball placement stencil 346 (e.g., $D_{S2} > D_{S1}$). Moreover, in some embodiments, the solder balls 358 forming the solder bumps 360 of the second bump assemblies 304 may have a different solder composition than the solder balls 350 forming the solder bumps 352 of the first bump assemblies 302. It is contemplated that the solder balls 350, 358 may have at least approximately the same diameter (e.g., $D_{B2} \approx D_{B1}$), in particular, where solder balls 350, 358 having different compositions are employed. In such instances, the apertures 348, 356 of the first and second solder ball placement stencils 346, 354 may likewise have at least approximately the same diameters (e.g., $D_{S2} \approx D_{S1}$).

Next, solder reflow is performed (Block 218). During reflow, the wafer is subjected to controlled heat (e.g., via a solder reflow oven), which melts the solder balls, securing the solder to the bump interfaces. FIGS. 8H and 9H illustrate the wafer 300 following solder reflow. As shown, the solder balls 350, 358 have reflowed to form solder bumps 352, 360 that at least substantially wet the full surface of the bump interfaces 330, 332, while collapsing under the influence of gravity to the lowest stress shape attainable due to surface tension of the solder. The solder balls 358 of the second bump assemblies 304 are illustrated as having collapsed into solder bumps 360 that have a domed shape due to the larger surface area ($A_{S2}$) of the bump interfaces 332 of the second bump assemblies 304, while the solder balls 350 of the first bump assemblies 302 are shown as having collapsed into solder bumps 352 that have a more spherical shape due to the smaller surface area ($A_{S1}$) of the bump interfaces 330 of the first bump assemblies 302. The solder bumps 360 of the second bump assemblies 304 thus contain a larger volume of solder than the solder bumps 352 of the first bump assemblies 302, while maintaining a standoff height ($H_2$) that is at least approximately equal to the standoff height ($H_1$) of the solder bumps 352 of the first bump assemblies 302.

The wafer may further be thinned by backgrinding the wafer (Block 220) using a suitable backgrinding process and segmented (e.g., diced) to separate the individual wafer-level chip-scale package devices (Block 222). In FIGS. 8H and 9H, the wafer 300 is illustrated as having been thinned following a backgrinding process in preparation of being diced using a segmentation process to form devices such as the wafer-level chip-scale package devices 100 illustrated in FIGS. 1 through 6.

Figure 10:
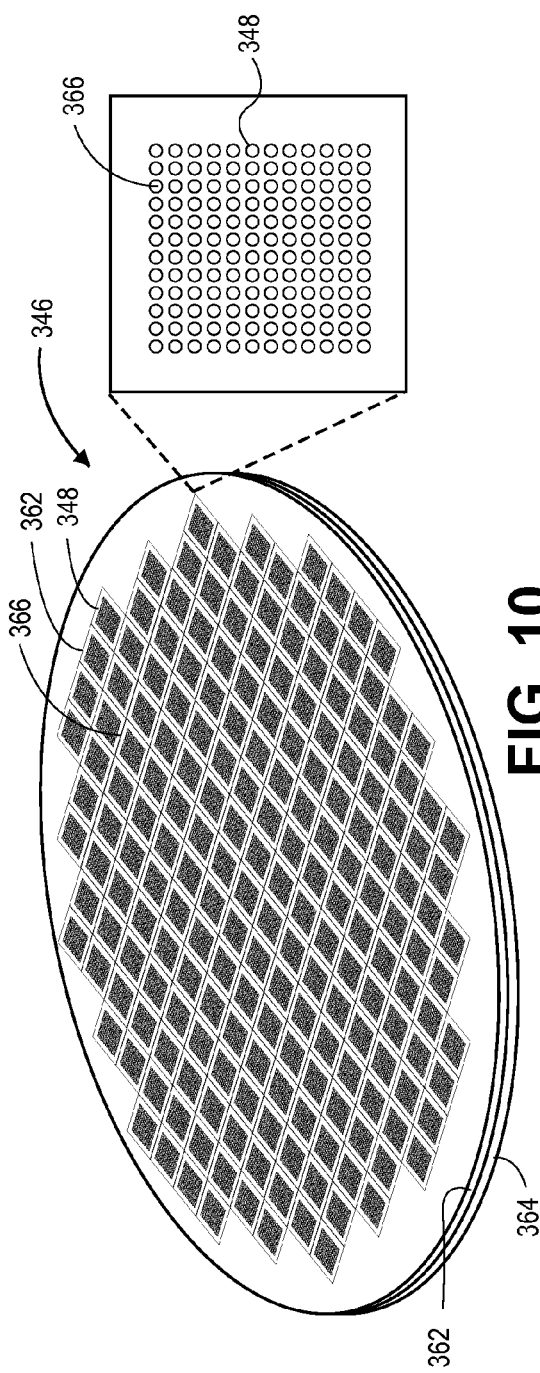
FIGS. 10 and 11 are diagrammatic top plan views of solder ball placement stencils suitable for use in fabricating wafer-level chip-scale package devices in accordance with the process shown in FIG. 7.
Figure 11:
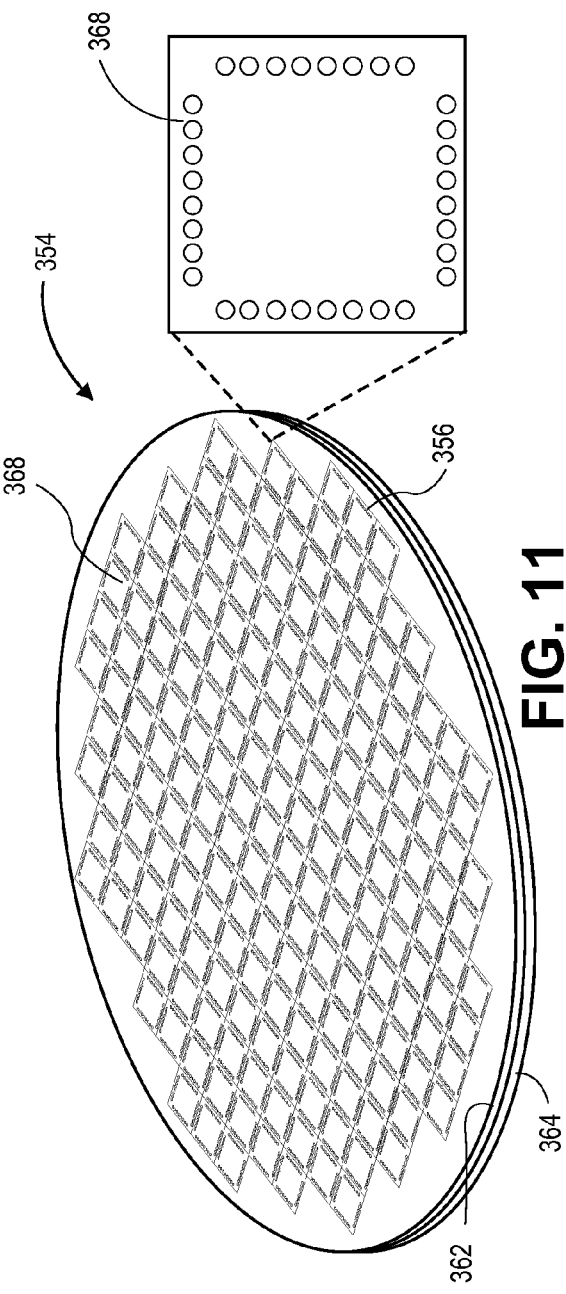

FIGS. 10 and 11 illustrate example solder ball placement stencils suitable for use in the fabrication of wafer-level chip-scale package devices in accordance with the process shown in FIG. 7 as shown in FIGS. 8A through 8H and 9A through 9H. As shown, the solder ball placement stencils 346, 354 may be generally round in shape and may have a diameter that is at least approximately equal to or greater than the diameter of the wafers that are being processed. However, it is contemplated that the stencils 346, 354 may have other shapes as required by the particular processing equipment used to place the solder balls on the wafer. Thickness of the solder ball placement stencils 346, 354 may be closely related to solder ball diameter ($D_{B1}$, $D_{B2}$) to ensure that the solder balls 350, 358 are satisfactorily embedded in the flux 344 applied to the bump interfaces 330, 332.

In one or more embodiments, the solder ball placement stencils 346, 354 may include a ball aperture layer 362 and a stand-off layer 364. The ball aperture layer 362 may be formed of a metal such as stainless steel, electroformed nickel, and so on. Apertures 348, 356 are formed in the ball aperture layer 362 using a technique appropriate to the material from which the ball aperture layer 362 is formed. For example, techniques suitable for use in forming apertures 348, 356 in the ball aperture layer 362 may include laser-cutting, chemical etching, and so on. Because solder balls having different sizes and/or different compositions may be placed, it is contemplated that the ball aperture layers 362 of the first solder ball placement stencil 346 and the second solder ball placement stencil 354 may be fabricated using different materials and/or fabrication processes. The stand-off layer 364 may formed of a photo-imageable dry-film resist deposited onto the underside of the ball aperture layer 362. The stand-off layer 364 prevents the ball aperture layer 362 from coming into contact with the wafer 300.

FIG. 10 illustrates a first solder ball placement stencil 346 configured to be applied to the wafer 300 for placement of solder balls 350 that form the solder bumps of the first bump assemblies 302. The stencil 346 includes one or more arrays 366 of apertures 348 extending through the stencil 346 that correspond to the locations of the bump interfaces 330 (e.g., UBM 334 (FIG. 8D) or copper pillars 338 (FIG. 9D)) of the first bump assemblies 302. As noted, the apertures 348 are sized to receive a single solder ball 350 to channel the solder ball 350 onto the bump interface 330. For example, the apertures 348 of the solder ball placement stencil 346 may have diameters ($D_{S1}$) that allow passage of a single solder ball 350 having a diameter ($D_{B1}$).

FIG. 11 illustrates a second solder ball placement stencil 354 configured to be applied to the wafer 300 for placement of solder balls that form the solder bumps of the second bump assemblies 304. The stencil 354 includes one or more arrays 368 of apertures 356 extending through the stencil 354 that correspond to the locations of the bump interfaces 332 (e.g., UBM 336 (FIG. 8D) or copper pillars 340 (FIG. 9D)) of the second bump assemblies 304. Again, the apertures 356 are sized to receive a single solder ball 358 to channel the solder ball 358 onto the bump interface 332. For example, the apertures 356 of the solder ball placement stencil 354 may have diameters ($D_{S2}$) that allow passage of a single solder ball 358 having a diameter ($D_{B2}$).

In some implementations, wafer-level chip-scale package chip devices may be provided that have multiple arrays of first bump assemblies and/or second bump assemblies. In such implementations, the bump assemblies of each array may comprise solder bumps having different sizes (surface areas), pitches, solder compositions, and/or bump interface configurations than the bump assemblies of other arrays. Accordingly, as shown in FIG. 7, the process steps of applying a solder ball placement stencil onto the wafer (Block 212), placing solder balls (Block 214), and removing the stencil from the wafer (Block 216) may be repeated for each array of bump assemblies formed on the integrated circuit chip, using additional solder ball placement stencils, which may have apertures sized and/or arranged for placement of solder balls of appropriate diameter and solder composition to form the solder bumps of these bump assemblies.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer-level chip-scale package device comprising:
    an integrated circuit chip, the integrated circuit chip comprising a first area in which bump assemblies are disposed and a second area in which bump assemblies are disposed, wherein bump assemblies disposed in the second area experience elevated levels of stress due to mechanical or thermal forces compared to bump assemblies disposed in the first area when the integrated circuit chip is mounted to a printed circuit board via the bump assemblies, where the first area is proximate to a center area of the integrated circuit chip and the second area is proximate to the perimeter of the integrated circuit chip:
    at least one array of first bump assemblies disposed on the integrated circuit chip within the first area, the first bump assemblies including solder bumps; and
    at least one array of second bump assemblies disposed on the integrated circuit chip within the second area, the second bump assemblies including solder bumps and at least one copper pillar, wherein the solder bumps of the second bump assemblies are larger than the solder bumps of the first bump assemblies to resist failure due to the elevated levels of stress, and the at least one array of second bump assemblies is configured to furnish only mechanical attachment of the wafer-level chip-scale package device to a printed circuit board.

2. The waver-level package device as recited in claim 1, wherein the solder bumps of the first bump assemblies generally have a first pitch and the solder bumps of the second bump assemblies generally have a second pitch, the second pitch greater than the first pitch.

3. The wafer-level chip-scale package device as recited in claim 1, wherein the solder bumps of the first bump assemblies have a first solder composition and the solder bumps of the second bump assemblies have a second solder composition different than the first solder composition.

4. The wafer-level chip-scale package device as recited in claim 1, wherein the second bump assemblies are configured to absorb higher levels of stress compared to the first bump assemblies.

5. The electronic device as recited in claim 1, wherein the solder bumps of the first bump assemblies have a first solder composition and the solder bumps of the second bump assemblies have a second solder composition.

6. The wafer-level chip-scale package device as recited in claim 1, wherein the solder bumps of the first bump assemblies generally have a first standoff height and the solder bumps of the second bump assemblies generally have a second standoff height, the second standoff height at least substantially equal to the first standoff height.

7. The wafer-level chip-scale package device as recited in claim 6, wherein the solder bumps of the first bump assemblies generally have a first surface area and the solder bumps of the second bump assemblies generally have a second surface area, the second surface area greater than the first surface area.

8. The wafer-level chip-scale package device as recited in claim 7, wherein the first bump assemblies and the second bump assemblies include bump interfaces configured to provide an interface boundary between the solder bumps and bonding pads of the integrated circuit chip, the bump interfaces of the first bump assemblies having a surface area at least approximately equal to the first surface area and the bump interfaces of the second bump assemblies having a surface area at least approximately equal to the second surface area.

9. The wafer-level chip-scale package device as recited in claim 8, wherein the surface areas of the bump interfaces and volumes of the solder bumps are selected so that the second standoff height is at least substantially equal to the first standoff height.

* * * * *